(12) United States Patent
Yamaoka

(10) Patent No.: US 6,415,399 B1
(45) Date of Patent: Jul. 2, 2002

(54) SEMICONDUCTOR MEMORY DEVICE REQUIRING PERFORMANCE OF PLURALITY OF TESTS FOR EACH OF PLURALITY OF MEMORY CIRCUITS AND METHOD FOR TESTING THE SAME

(75) Inventor: Shigeru Yamaoka, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/360,639

(22) Filed: Jul. 26, 1999

(30) Foreign Application Priority Data

Jan. 18, 1999 (JP) ............................................. 11-009264

(51) Int. Cl.[7] ............................................. G11C 29/00
(52) U.S. Cl. ........................................ 714/718; 365/201
(58) Field of Search ................................ 714/718–719, 714/738, 721; 365/201

(56) References Cited

U.S. PATENT DOCUMENTS

| 5,079,744 A | * | 1/1992 | Tobita et al. | ................ 365/201 |
| 5,629,943 A | * | 5/1997 | McClure | ..................... 714/718 |
| 5,646,948 A | * | 7/1997 | Kobayashi et al. | ......... 714/719 |
| 5,961,653 A | * | 10/1999 | Kalter et al. | ................... 714/7 |
| 6,233,184 B1 | * | 5/2001 | Barth et al. | ................ 365/201 |

FOREIGN PATENT DOCUMENTS

JP         7-93997      4/1995

* cited by examiner

*Primary Examiner*—Albert Decady
*Assistant Examiner*—Cynthia R Harris
(74) *Attorney, Agent, or Firm*—McDermott, Will & Emery

(57) ABSTRACT

A test pattern generation circuit for generating a test pattern for a disturb test is provided in an SDRAM. A test pattern generated in the test pattern generation circuit is supplied to a circuit relating to a selected bank and a test pattern is supplied from a tester to a circuit relating to other bank. As more than one test can be simultaneously performed, test time can be reduced.

5 Claims, 7 Drawing Sheets

0 : DISTURB TEST
1 : TEST OTHER THAN DISTURB TEST (REQUIRED TIME $\frac{Ta}{4}$)

1 : DISTURB TEST
3 : TEST OTHER THAN DISTURB TEST (REQUIRED TIME $\frac{Ta}{4}$)

3 : DISTURB TEST
2 : TEST OTHER THAN DISTURB TEST (REQUIRED TIME $\frac{Ta}{4}$)

2 : DISTURB TEST
0 : TEST OTHER THAN DISTURB TEST (REQUIRED TIME $\frac{Ta}{4}$)

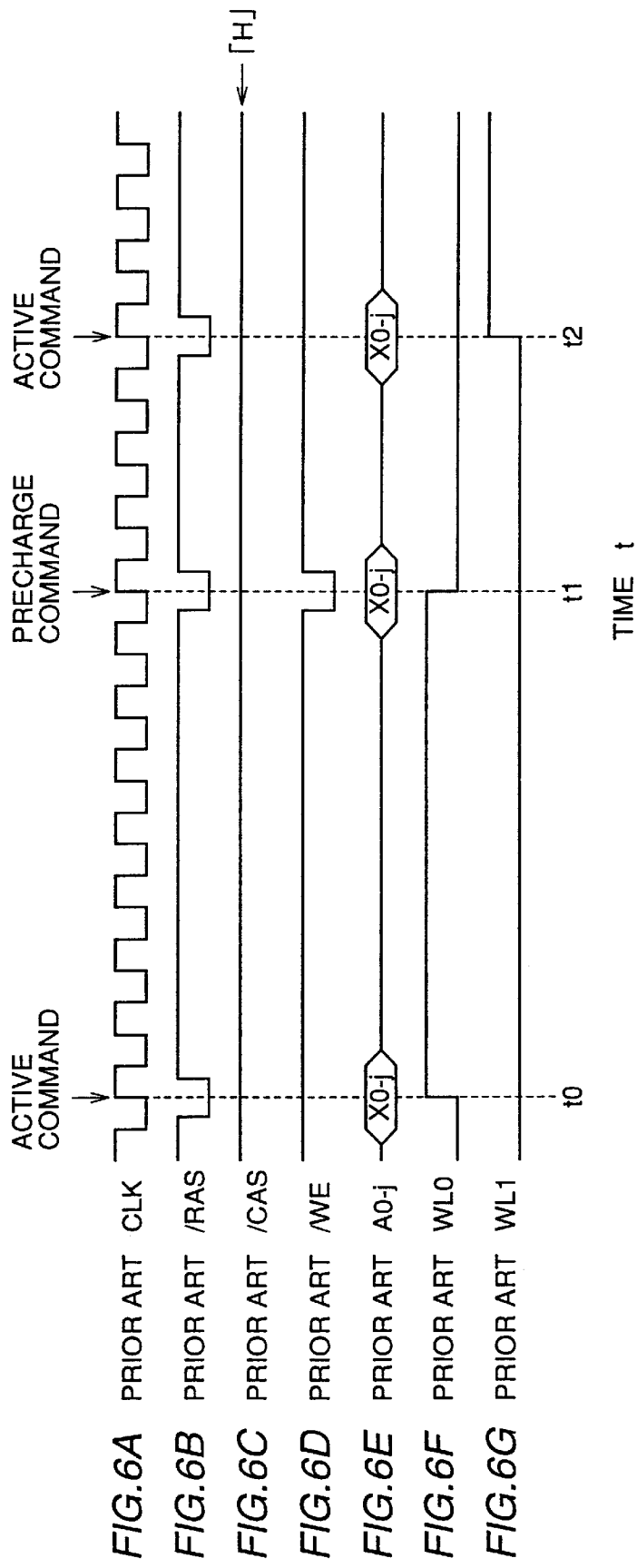

0~#3
DISTURB TEST (REQUIRED TIME Ta)

0~#3
TEST OTHER THAN
DISTURB TEST (REQUIRED TIME Tb)

SEMICONDUCTOR MEMORY DEVICE REQUIRING PERFORMANCE OF PLURALITY OF TESTS FOR EACH OF PLURALITY OF MEMORY CIRCUITS AND METHOD FOR TESTING THE SAME

BACKGROUND OF THE INVENTION

1. Field of the Invention

The present invention relates to a semiconductor memory device and a method for testing a semiconductor device, and more particularly to a semiconductor memory device requiring performance of a plurality of tests for each of plurality of memory circuits and a method for testing the same.

2. Description of the Background Art

FIG. 4 is a block diagram showing a structure of a synchronous dynamic random access memory (hereinafter referred to as SDRAM) 30 connected to a tester 20. First, SDRAM 30 will be described.

With reference to FIG. 4, SDRAM 30 includes a control signal generation circuit 31, a command decoder 32, an address buffer 33, a clock buffer 34, memory arrays 35a–35d, row decoders (RD) 36a–36d, column decoders (CD) 37a–37d, sense amplifiers+input/output control circuits 38a–38d and a data input/output circuit 39.

Control signal generation circuit 31 receives a variety of control signals such as /RAS, /CAS and /WE supplied from an external source and generates and supplies a variety of internal control signals to command decoder 32. Command decoder 32 decodes these internal control signals, generates a variety of command signals CMD0–CMDi (where i is an integer equal to or larger than 0) and controls SDRAM 30 as a whole by these command signals CMD0–CMDi.

Address buffer 33 takes in address signals A0–Aj (where j is an integer equal to or larger than 0) supplied from an external source as row address signals X0–Xj or column address signals Y0–Yj, and supplies row address signals X0–Xj and column address signals Y0–Yj to row decoders 36a–36d and column decoder 37a–37d, respectively. Clock buffer 34 receives a clock signal CLK supplied from an external source, generates and supplies to SDRAM 30 as a whole an internal clock signal CLK'. SDRAM 30 operates in synchronization with internal clock signal CLK'.

Memory arrays 35a–35d constitute banks #0–#3, respectively. Each of memory arrays 35a–35d is arranged as a matrix and includes a plurality of memory cells each storing one-bit data. Each memory cell is located at a certain address designated by a row address and a column address.

Row decoders 36a–36d designate row addresses of memory arrays 35a–35d, respectively in response to row address signals X0–Xj supplied from address buffer 33. Column decoders 37a–37d designate column addresses of memory arrays 35a–35d, respectively in response to column address signals Y0–Yj supplied from address buffer 33.

Sense amplifiers+input/output control circuits 38a–38d connect memory cells at addresses designated by row decoders 36a–36d and column decoder 37a–37d, respectively, to one ends of data input/output line pairs IOPs. Another ends of data input/output line pairs IOPs are connected to data input/output circuit 39. Data input/output circuit 39 supplies data input from an external source to a selected memory cell via data input/output line pair IOP in a writing mode, and supplies as an output data read from a selected memory cell to an external device in a reading mode.

FIG. 5 is a partially omitted circuit block diagram showing a structure of memory array 35a and sense amplifier+ input/output control circuit 38a of SDRAM 30 shown in FIG. 4.

With reference to FIG. 5, memory array 35a includes a plurality of memory cells MCs arranged in a matrix, word lines WLs arranged for respective rows, and bit line pairs BLs, /BLs arranged for respective columns.

Each memory cell MC is of a well known type in the art and includes an access N channel MOS transistor and an information storing capacitor. Word line WL transmits an output of row decoder 36a and activates a memory cell MC in a selected row. Bit line pair BL, /BL serves for input/output of a data signal to/from a selected memory cell MC.

Sense amplifier+input/output control circuit 38a includes column select gates 41s, sense amplifiers 42s and equalizers 43s arranged corresponding to respective columns. Column select gate 41 includes a pair of N channel MOS transistors connected between bit line pair BL, /BL and data input/output line pair IO, /IO. A gate of each N channel MOS transistor is connected to column decoder 37a via a column select line CSL. When column select line CSL is activated by column decoder 37a to an "H" (logical high) level which is a select level, a pair of N channel MOS transistors is rendered conductive coupling bit line pair BL, /BL and data input/output line pair IO, /IO.

Sense amplifier 42 amplifies a minor potential difference between bit line BL and bit line /BL to the level of power supply voltage Vcc in response to activation of sense amplifier activation signals SE, /SE respectively to an "H" level and to an "L" (logical low) level. Equalizer 43 equalizes the potentials of bit line BL and bit line /BL to a bit line voltage VBL (=Vcc/2) in response to activation of a bit line equalization signal BLEQ to an "H" level. Memory arrays 35b–35d and sense amplifiers+input/output control circuits 38b–28d are of the same structure as memory array 35a and sense amplifier+input/output control circuit 38a. Here, signals SE, /SE, BLEQ are included in command signals CMD0–CMDi shown in FIG. 4.

Next, an operation of SDRAM 30 shown in FIGS. 4 and 5 will be briefly described. In the writing mode, one of column decoders 37a–37d activates column select line CSL in a column corresponding to column address signals Y0–Yj to an activation level, that is an "H" level, rendering column select gate 41 conductive.

Data input/output circuit 39 supplies data to be written supplied from an external source to a bit line pair BL, /BL of a selected column via data input/output line pair IOP. Data to be written is given as a potential difference between bit line BL and bit line /BL. Then, one of row decoders 36a–36d activates word line WL of a row corresponding to row address signals X0–Xj to an "H" level, that is the select level, rendering an N channel MOS transistor of a memory cell MC in the row conductive. Electric charges of an amount corresponding to the potential of bit line BL or /BL is stored in the capacitor of the selected memory cell MC.

In the reading mode, first, bit line equalization signal BLEQ is pulled down to an "L" level and the equalization of bit lines BL and /BL is stopped. One of row decoders 36a–36d pulls up a word line WL of a row corresponding to row address signals X0–Xj to an "H" level that is the select level. The potentials of bit lines BL and /BL change by a minor amount according to the amount of electric charges in a capacitor of an activated memory cell MC.

Then, sense amplifier activation signals SE and /SE attain an "H" level and "L" level, respectively and sense amplifier 42 is activated. When the potential of bit line BL is higher than the potential of bit line /BL by a minor amount, the potential of hit line BL is pulled up to an "H" level and the potential of bit line /BL is pulled down to an "L" level.

Conversely, when the potential of bit line /BL is higher than the potential of bit line BL by a minor amount, the potential of bit line /BL is pulled up to an "H" level and the potential of bit line BL is pulled down to an "L" level.

One of column decoders 37a–37d then activates column select line CSL of a column corresponding to column address signals Y0–Yj to an "H" level, that is the select level, rendering column select gate 41 of the column conductive. Data of bit line pair BL, /BL of the selected column is supplied to data input/output circuit 39 via column select gate 41 and data input/output line pair IO, /IO. Data input/output circuit 39 supplies read data to an external device.

To guarantee the quality of an SDRAM such as SDRAM 30, a variety of tests are performed before delivery. Tests include long period tests and short period tests. Long period tests include a disturb test, a long cycle type test (read modify write Y march test, for example) and so on, and short period tests include a typical function test and so on.

In the disturb test, data "0" or "1" is first written into all the memory cells MCs. Then, word line WL is turned to an "H" level that is the select level for a predetermined period (64 ms, for example) one by one (or block by block). Thus the memory cell MC data destruction caused by noise on an adjacent word line WL is accelerated. The higher the power supply voltage Vcc, the greater the effect of acceleration. Finally, data of all memory cells MCs are read and checked to determine whether the data of each memory cell MC is destroyed or not. The above described test is performed for a case in which data "0" is written to memory cells MCs and a case in which data "1" is written to memory cells MCs. The disturb test of 64 M-bit SDRAM takes 512 seconds, for example. The time period required for writing/reading of data to/from all memory cells MCs is significantly shorter than the disturb time.

In addition, in the long cycle type test, data "0" is first written into all the memory cells MCs. Then written data "0" is read and the inverted data "1" is written into the same address. Then written data "1" is read and the inverted data "0" is written into the same address. Here, writing/reading is performed at a longer cycle than a normal cycle. Under this condition, output level drop, word line level drop, leakage of bit lines and so on are checked. In the long cycle type test, as the writing/reading is performed at a longer cycle than the normal cycle for each memory cell MC, the test period becomes longer than that of the normal test.

Further in the typical function test, whether a basic writing operation and reading operation are correctly performed or not is checked. In this test, as only a simple writing/reading operation is performed for a memory cell MC connected to a word line WL, only a short test time, for example, of one second is required.

FIGS. 6A–6G are time charts showing operations of tester 20 and SDRAM 30 during the disturb test. Tester 20 supplies clock signal CLK, control signals /RAS, /CAS and /WE, address signals A0–Aj and so on to SDRAM 30. At the rising edge of clock signal CLK at time to, control signals /RAS, /CAS and /WE attain an "L" level, an "H" level and "H" level, respectively, and an active command is supplied from tester 20 to SDRAM 30. Then, address signals A0–Aj are taken in as row address signals X0–Xj and a word line WL0 corresponding to the row address signals X0–Xj is activated to an "H" level which is the select level.

Then at the rising edge of clock signal CLK at time t1 a predetermined time period (64 ms, for example) after the time to, control signals /RAS, /CAS and /WE attain an "L" level, an "H" level and an "L" level, respectively and a precharge command is supplied from tester 20 to SDRAM 30. Then, address signals A0–Aj are taken in as row address signals X0–Xj, and word line WL0 at an "H" level is turned to an "L" level and a bank having a word line WL1 to be next rendered an "H" level is precharged. Thus, all the word lines WLs of all banks #0–#3 each attain an "H" level for a predetermined time period.

FIGS. 7A and 7B schematically show a conventional test procedure. The disturb test is first performed for all banks #0–#3 and then a test (such as the typical function test) other than the disturb test are performed for all banks #0–#3. If the time required for the disturb test is Ta and the time required for another test is Tb, test time Ta+Tb is required in total.

In the conventional test procedure, however, as all signals necessary for the test of SDRAM 30 are supplied from tester 20, more than one test cannot be simultaneously performed whereby test time becomes long.

SUMMARY OF THE INVENTION

A primary object of the present invention is, therefore, to provide a semiconductor memory device and a method of testing the same allowing reduction of test time.

Thus, a semiconductor memory device according to the present invention includes a test pattern generation circuit generating a control signal and an address signal for performing a first test, a select circuit for selecting one memory circuit of a plurality of memory circuits, and a switch circuit provided corresponding to each memory circuit for supplying the control signal and the address signal generated by the test pattern generation circuit to a corresponding memory circuit when the corresponding memory circuit is selected by the select circuit, and for supplying a control signal and an address signal supplied from an external source for performing a second test to the corresponding memory circuit during other period. As the first test can be performed for the selected memory circuit while the second test is performed for other memory circuit, test time can be reduced compared with the conventional procedure where first and second tests cannot be simultaneously performed.

Preferably, the select circuit sequentially selects each of the plurality of memory circuits for a time necessary for the first test. Thus, first and second tests can readily be performed for all memory circuits.

Still preferably, the first test is the disturb test and the second test is the test other than the disturb test. In this case, the present invention is particularly effective.

In a method of testing a semiconductor according to the present invention, a test pattern generation circuit generating a control signal and an address signal for performing a first test is provided in a semiconductor memory device, then one memory circuit of a plurality of memory circuits is selected, the control signal and the address signal generated in the test pattern generation circuit is supplied to the selected memory circuit, and a control signal and an address signal for performing a second test is supplied from a source external to the semiconductor memory device to other memory circuits. Thus, as the first test can be performed for the selected memory circuit while the second test is performed for other memory circuits, test time can be reduced compared with the conventional procedure where first and second tests cannot simultaneously be performed.

Preferably, the first test is the disturb test and the second test is the test other than the disturb test. In this case, the present invention is particularly effective.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A–6G are time charts showing a disturb test of an SDRAM shown in FIG. 4.

DESCRIPTION OF THE PREFERRED EMBODIMENTS

Figure 1:
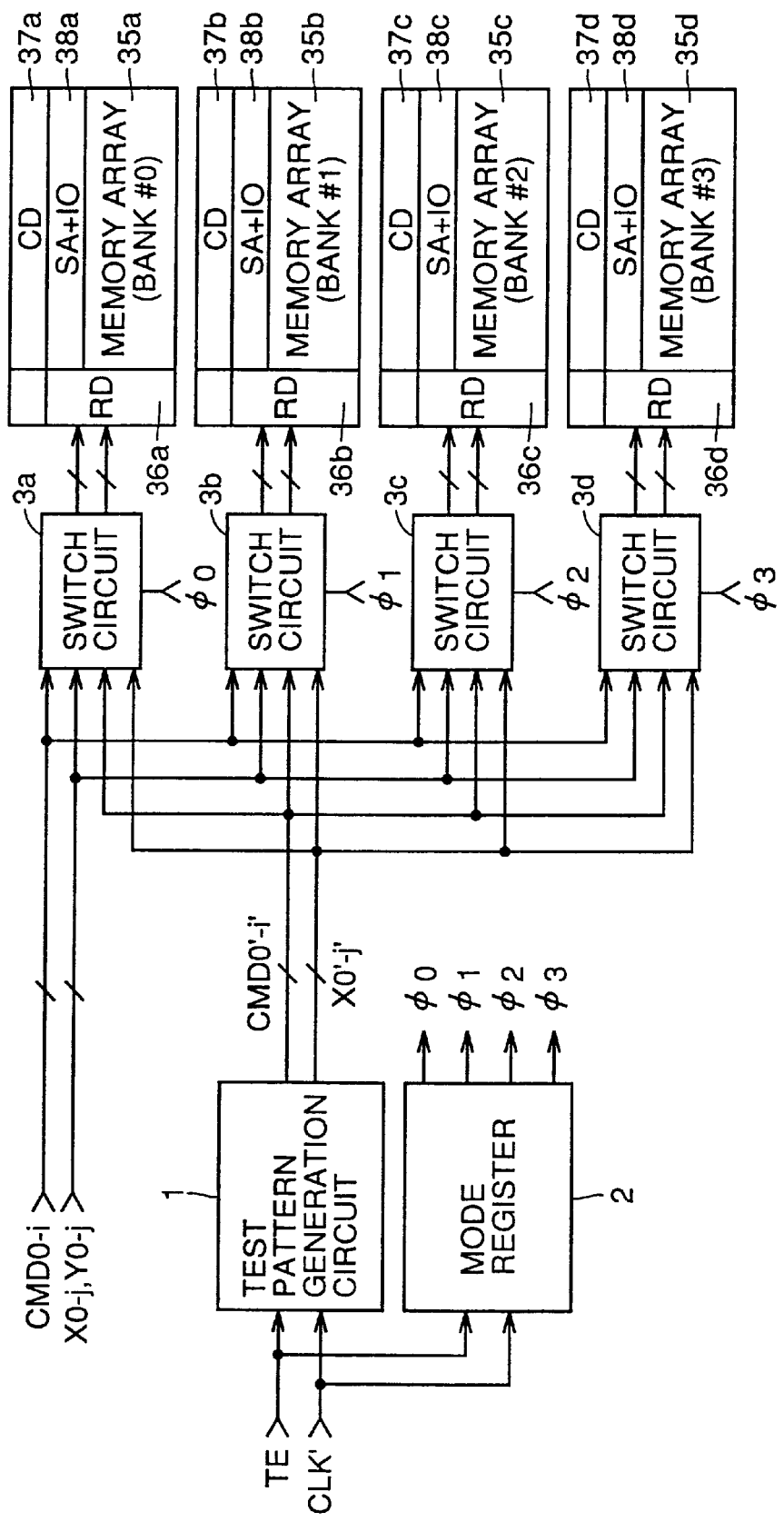
FIG. 1 is a block diagram showing a main portion of an SDRAM according to one embodiment of the present invention.

FIG. 1 is a block diagram showing a main portion of an SDRAM according to one embodiment of the present invention. With reference to FIG. 1, an SDRAM is different from a conventional SDRAM 30 in that a test pattern generation circuit 1, a mode register 2 and switch circuits 3a–3d are newly provided.

Test pattern generation circuit 1 operates in synchronization with internal clock signal CLK' and supplies command signals CMDO'–CMDi' and row address signals X0'–Xj' in response to the receipt of a test signal TE from command decoder 32. Test signal TE is a signal supplied from command decoder 32 in response to the supply of control signals /RAS, /CAS, /WE and so on from tester 20 to the SDRAM at a predetermined level and timing. Command signals CMD0'–CMDi' have the same waveforms as output signals CMD0–CMDi of command decoder 32 at the time of disturb test. Row address signals X0'–Xj' have the same waveforms as output signals X0–Xj of address buffer 33 at the time of disturb test.

Mode register 2 operates in synchronization with test pattern generation circuit 1 and supplies select signals φ0–φ3 to switch circuits 3a–3d, respectively. Select signals 100 0–φ3 attain an "L" level only for a period during which banks #0–#3 are designated by row address signals X0'–Xj' supplied from test pattern generation circuit 1, respectively.

Figure 2:
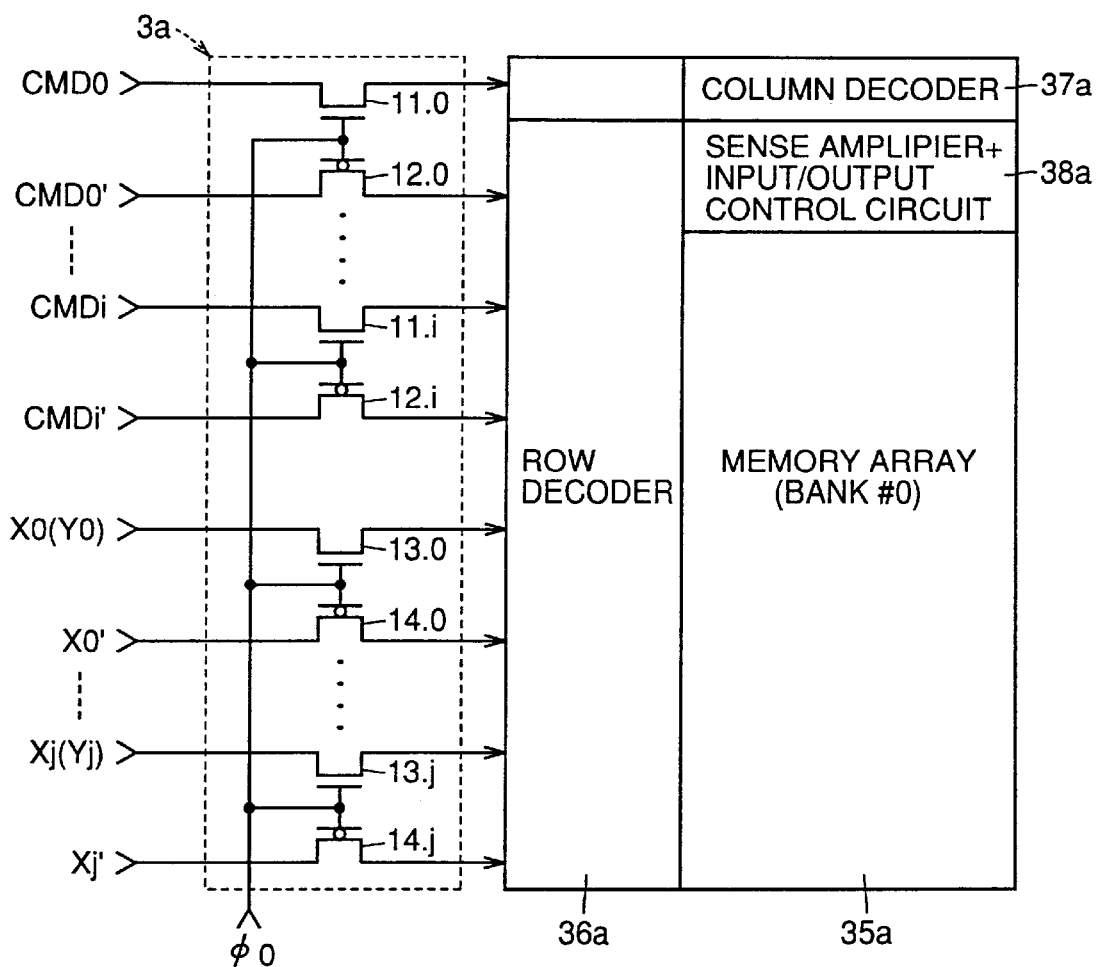
FIG. 2 is a circuit diagram showing a structure of a switch circuit shown in FIG. 1.
Figure 3A:
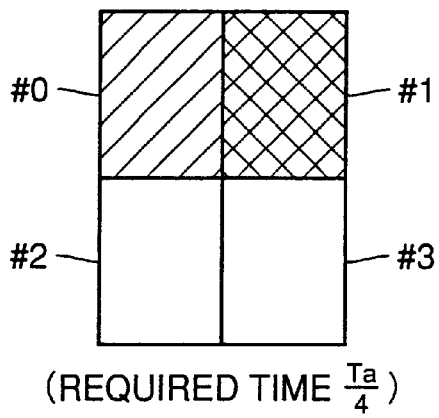
FIGS. 3A–3D are graphical representations showing a method of testing an SDRAM shown in FIG. 1.
Figure 3B:
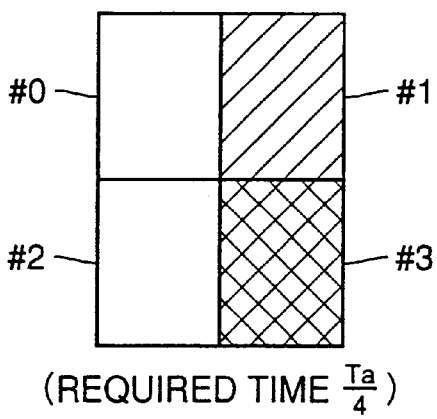
Figure 3C:
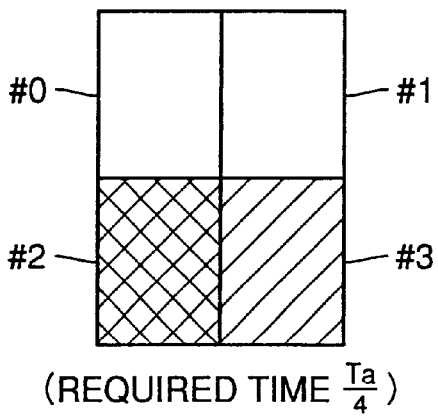
Figure 3D:
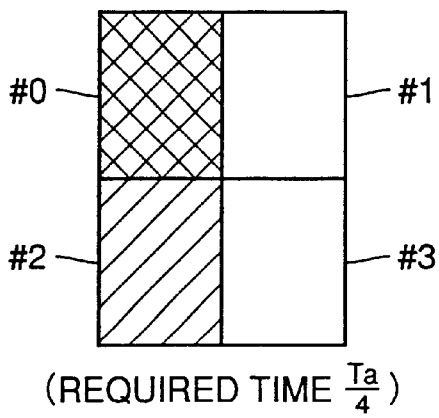
Figure 4:
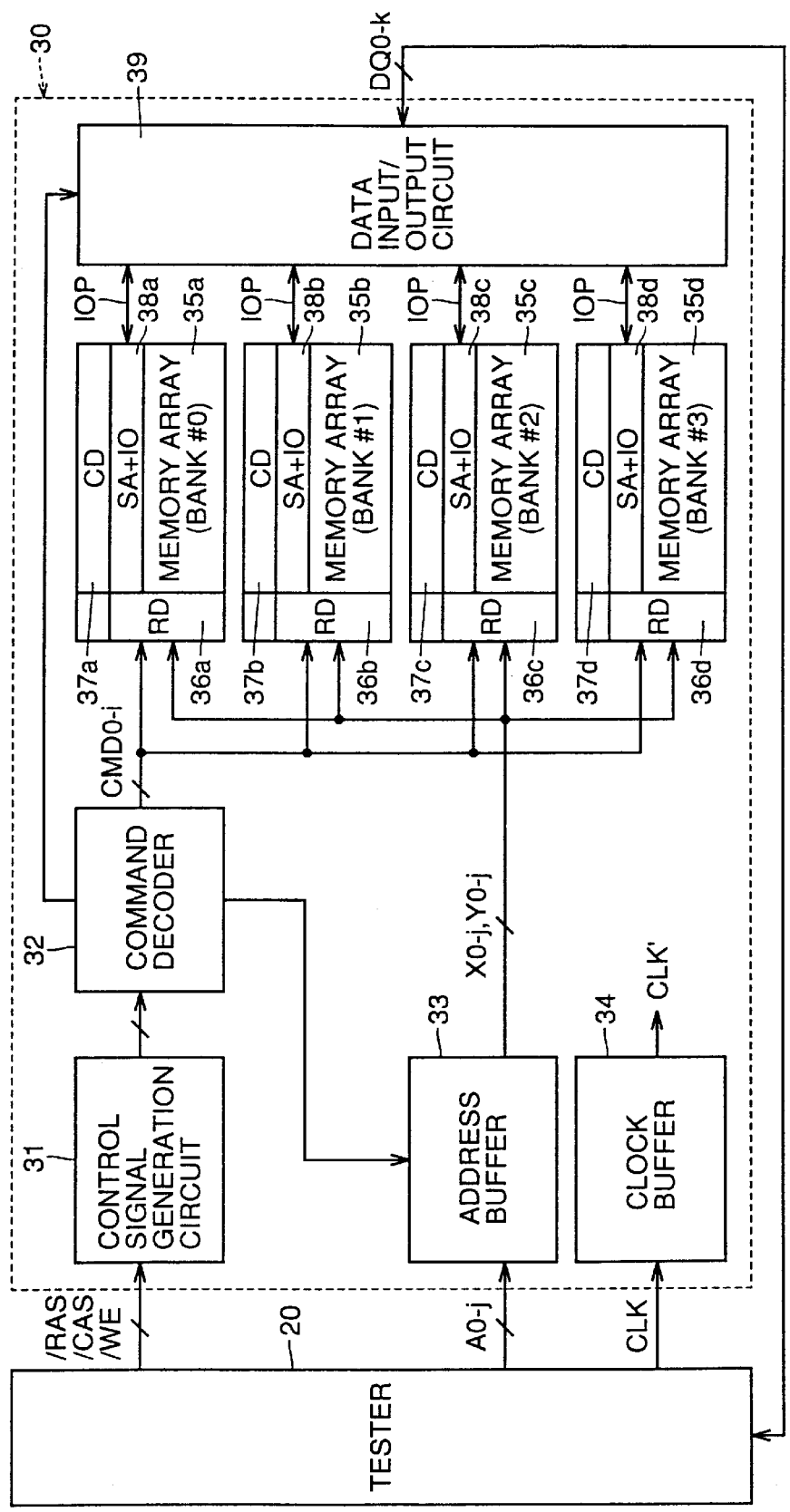
FIG. 4 is a block diagram showing a structure of a conventional SDRAM.
Figure 5:
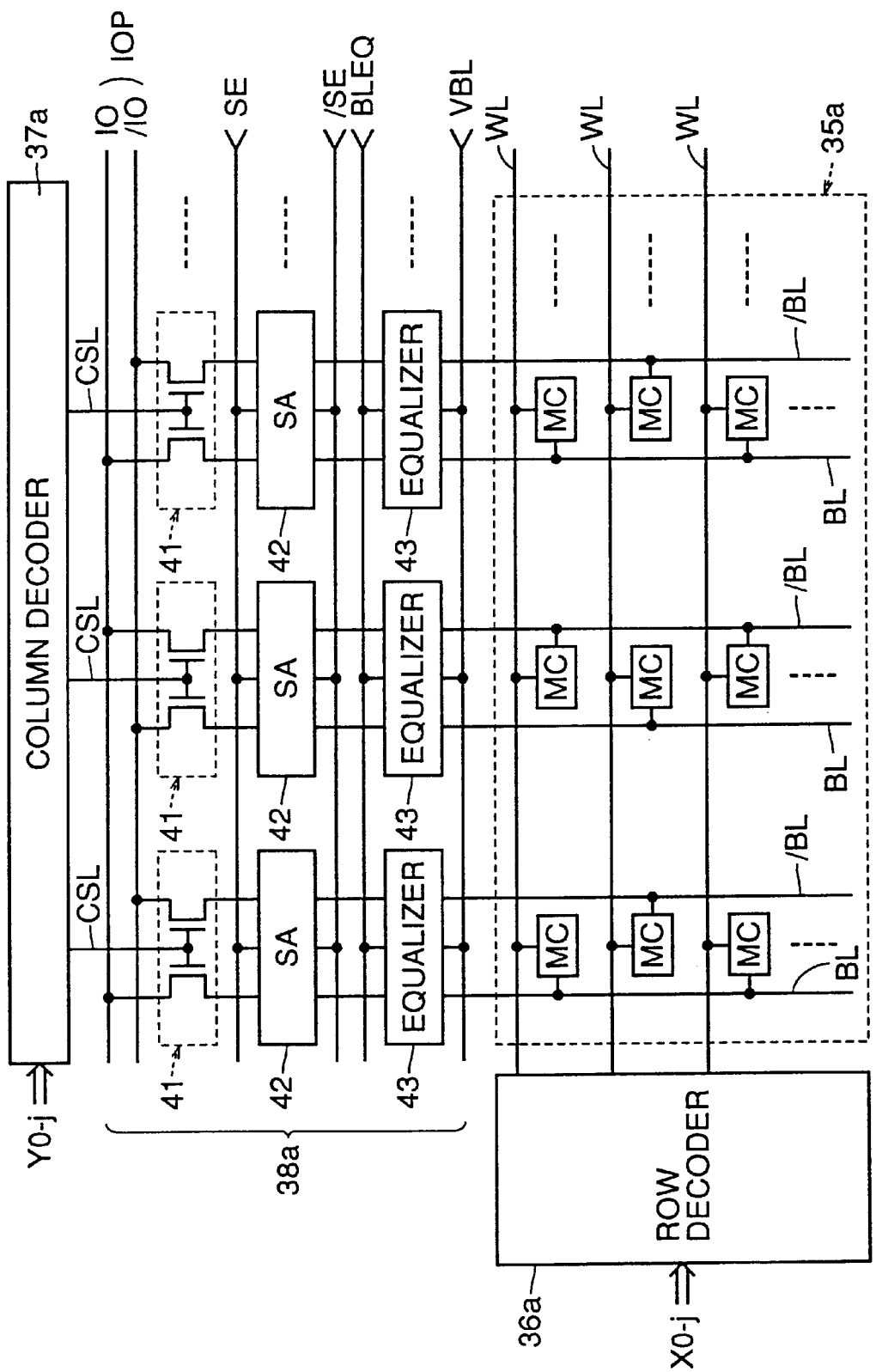
FIG. 5 is a circuit block diagram showing a structure of a memory array and sense amplifier+input/output control circuit shown in FIG. 4.
Figure 7A:
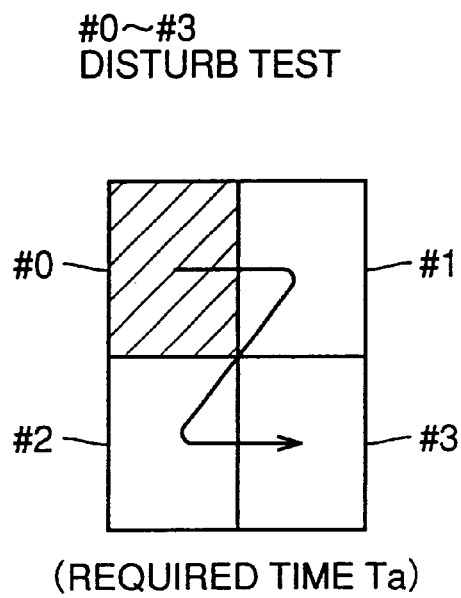
FIGS. 7A and 7B are graphical representations of a method of testing an SDRAM shown in FIG. 4.
Figure 7B:
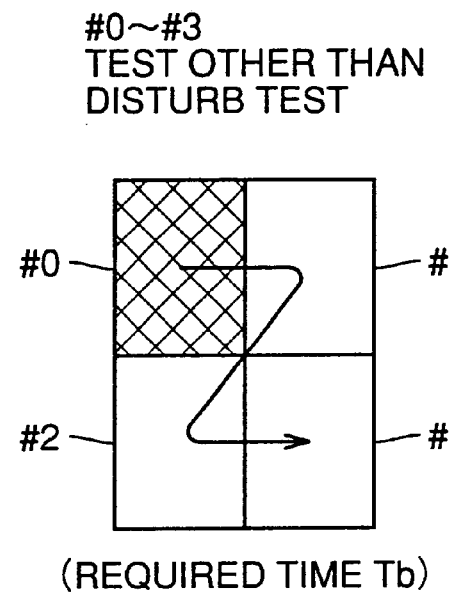

Switch circuits 3a–3d are provided corresponding to banks #0–#3, respectively, and are controlled by output signals φ0–φ3 of mode register 2. As shown in FIG. 2, switch circuit 3a includes N channel MOS transistors 11.0–11.i and 13.0–13.j and P channel MOS transistors 12.0–12.i and 14.0–14.j. One electrodes of N channel MOS transistors 11.0–11.i and 13.0–13.j receive signals CMD0–CMDi and X0(Y0)–Xj(Yj), respectively and another electrodes thereof are connected to circuits 36a–38a relating to bank#0, and each gate thereof receives select signal φ0. One electrodes of P channel MOS transistors 12.0–12.i and 14.0–14.j receive signals CMD0'–CMDi' and X0'–Xj', respectively, and another electrodes are connected to circuits 36a–38d relating to bank #0, and each gate thereof receives select signal φ0.

Therefore, when select signal φ0 is at an "H" level, output signals CMD0–CMDi and X0(Y0)–Xj(Yj) from command decoder 32 and address buffer 33 are supplied to circuits 36a–38a relating to bank #0, and conversely when select signal φ0 is at an "L" level, output signals CMD0'–CMDi' and X0'–Xj' of test pattern generation circuit 1 are supplied to circuits 36a–38a relating to bank #0. Switch circuits 3b–3d operate in the same manner as switch circuit 3a.

FIGS. 3A–3D schematically show the method of testing the SDRAM. With reference to FIGS. 3A–3D, in the SDRAM, the disturb test is performed for bank #0 while the short period test (such as the typical function test) other than the disturb test is performed for bank #1.

In a circuit shown in FIG. 1, test signal TE is activated to an activation level to activate test pattern generation circuit 1 and mode register 2, and then signal φ0 alone of select signals φ0–φ3 attains an "L" level and command signals CMD0'–CMDi' and address signals X0'–Xj' are generated. In addition, tester 20 supplies control signals /RAS, /CAS, /WE, address signals A0–Aj, clock signal CLK and so on to the SDRAM and then command decoder 32 supplies command signals CMD0–CMDi and address buffer 33 supplies address signals X0–Xj and Y0–Yj.

Here, as only select signal φ0 of select signals φ0–φ3 is at an "L" level, output signals CMD0'–CMDi' and X0'–Xj' of test pattern generation circuit 1 are supplied to circuits 36a–38a relating to bank #0 and output signals CMD0–CMDi, X0–Xj and Y0–Yj of command decoder 32 and address buffer 33 are supplied to circuits 36b–38d relating to other banks #1–#3. Therefore the disturb test is performed in bank #0 and the test other than the disturb test is performed in bank #1 designated by address signals X0–Xj and Y0–Yj.

As the time required for the disturb test of bank #0 is Ta/4 and the time required for the test of bank #1 is Tb/4 (<Ta/4), total time required for the disturb test of bank #0 and the test for bank #1 is Ta/4.

When the disturb test of bank #0 and the test of bank #1 are completed, only signal φ1 of select signals φ0–φ3 attains an "L" level. Then output signals CMD0'–CMDi' and X0'–Xj' of test pattern generation circuit 1 are supplied to circuits 36b–38b relating to bank #1 and output signals CMD0–CMDi, X0–Xj and Y0–Yj of command decoder 32 and address buffer 33 are supplied to circuits 36c–38a relating to other banks #2, #3 and #0. Then, the disturb test is performed for bank #1 and the test other than the disturb test is performed for bank #3 designated by address signals X0–Xj and Y0–Yj. The time required for the disturb test of bank #1 and the test of bank #3 is Ta/4.

When the disturb test of bank #1 and the test of bank #3 are completed, only select signal φ3 of select signals φ0–φ3 attains an "L" level. Then, output signals CMD0'–CMDi' and X0'–Xj' of test pattern generation circuit 1 are supplied to circuits 36d–38d relating to bank #3 and output signals CMD0–CMDi, X0–Xj and Y0–Yj of command decoder 32 and address buffer 33 are supplied to circuits 36a–38c relating to other banks #0–#2. Then, the disturb test is performed for bank #3 and the test other than the disturb test is performed for bank #2 designated by address signals X0–Xj and Y0–Yj. The time required for the disturb test of bank #3 and the test of bank #2 is Ta/4.

When the disturb test of bank #3 and the test of bank #2 are completed, only select signal φ2 of select signals φ0–φ3 attains an "L" level. Then, output signals CMD0'–CMDi' and X0'–Xj' of test pattern generation circuit 1 are supplied to circuits 36c–38c relating to bank #2 and output signals CMD0–CMDi, X0–Xj and Y0–Yj of command decoder 32 and address buffer 33 are supplied to circuits 36d–38b relating to other banks #3, #0 and #1. Then, the disturb test is performed for bank #2 and the test other than the disturb test is performed for bank #0 designated by address signals X0–Xj and Y0–Yj. The time required for the disturb test of bank #2 and the test of bank #0 is Ta/4. Therefore, the time required for the disturb test and other tests of banks #0–#3 is Ta, shorter than the conventional test time Ta+Tb.

The embodiment of the present invention is provided with test pattern generation circuit 1 for generating a test pattern for the disturb test and switch circuits 3a–3d for supplying output signals CMD0'–CMDi' and X0'–Xj' of test pattern generation circuit 1 to a desired bank and for supplying output signals CMD0–CMDi, X0–Xj and Y0–Yj of command decoder 32 and address buffer 33 to other banks. Thus, as the disturb test for a certain bank can be performed by test pattern generation circuit 1 while the test other than the disturb test is performed for another bank by tester 20, test time can be reduced compared with the conventional procedure in which more than one test cannot simultaneously be performed.

In addition, though the embodiment is provided with only one test pattern generation circuit 1 for the disturb test, a plurality of test pattern generation circuits may be provided for long period test. For example, a first test pattern generation circuit for disturb test and a second test pattern generation circuit for long cycle type test can be provided. Then, the disturb test may be performed for one bank by the first test pattern generation circuit, the long cycle type test may be performed for another bank by the second test pattern generation circuit, and the function test may be performed for still another bank by the tester.

In addition, though in the embodiment the test other than the disturb test is performed only for one bank while the disturb test is performed for another bank, the embodiment is not intended for limitation and the test other than the disturb test may be performed for two or three other banks while the disturb test is performed for one bank. In FIG. 3, for example, while the disturb test is performed for bank #0, other test can be performed for other banks #1–#3.

Although the present invention has been described and illustrated in detail, it is clearly understood that the same is by way of illustration and example only and is not to be taken by way of limitation, the Spirit and scope of the present invention being limited only by the terms of the appended claims.

What is claimed is:

1. A semiconductor memory device having a test mode for simultaneously performing a first test in one memory circuit of a plurality of memory circuits and a second test different from the first test in one or more of other memory circuits, comprising:

a test pattern generation circuit for generating a control signal and an address signal for performing said first test in said test mode;

a select circuit for selecting a memory circuit of said plurality of memory circuits in said test mode; and a switch circuit provided corresponding to each memory circuit for supplying the control signal and the address signal generated by said test pattern generation circuit to a corresponding memory circuit when the corresponding memory circuit is selected by said select circuit, and supplying a control signal and an address signal supplied from an external source for performing said second test to the corresponding memory circuit during other period.

2. The semiconductor memory device according to claim 1, wherein said select circuit sequentially selects each of said plurality of memory circuits for a time required for said first test.

3. The semiconductor memory device according to claim 1, wherein each memory circuit includes, a plurality of memory cells arranged in a matrix, a word line arranged corresponding to each row and a bit line pair arranged corresponding to each column, and said first test is a disturb test for accelerating destruction of data previously written into each memory cell by turning each word line of each memory circuit to a select level for a predetermined time period, and said second test is a test other than said disturb test.

4. A method of testing a semiconductor for simultaneously performing a first test in one memory circuit of a plurality of memory circuits included in a semiconductor memory device and a second test different from the first test in one or more of other memory circuits, wherein, a test pattern generation circuit for generating a control signal and an address signal for performing said first test is provided in said semiconductor memory device, one memory circuit of said plurality of memory circuits is selected, and the control signal and the address signal generated by said test pattern generation circuit is supplied to a selected memory circuit, and a control signal and an address signal for performing said second test is supplied from an external source of said semiconductor memory device to other memory circuits.

5. The method of testing the semiconductor according to claim 4 wherein each memory circuit includes, a plurality of memory cells arranged in a matrix, a word line arranged corresponding to each row, and a bit line pair arranged corresponding to each column, and said first test is a disturb test for accelerating destruction of data previously written into each memory cell by turning each word line of each memory circuit to a select level for a predetermined time period, and said second test is a test other than said disturb test.

* * * * *